(12) United States Patent
Liaw

(10) Patent No.: US 9,831,253 B2
(45) Date of Patent: *Nov. 28, 2017

(54) FINFET MEMORY DEVICE

(71) Applicant: Taiwan Semiconductor Manufacturing Company, Ltd., Hsin-Chu (TW)

(72) Inventor: Jhon-Jhy Liaw, Zhudong Township (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

This patent is subject to a terminal disclaimer.

(21) Appl. No.: 15/357,972

(22) Filed: Nov. 21, 2016

(65) Prior Publication Data

US 2017/0077106 A1 Mar. 16, 2017

Related U.S. Application Data

(60) Continuation of application No. 14/721,559, filed on May 26, 2015, now Pat. No. 9,502,419, which is a
(Continued)

(51) Int. Cl.
*H01L 27/11* (2006.01)
*G11C 11/412* (2006.01)
(Continued)

(52) U.S. Cl.
CPC ........ *H01L 27/1116* (2013.01); *G11C 11/412* (2013.01); *G11C 11/419* (2013.01);
(Continued)

(58) Field of Classification Search
CPC .......... H01L 27/0207; G11C 11/412
(Continued)

(56) References Cited

U.S. PATENT DOCUMENTS 6,924,560 B2 8/2005 Wang et al.
7,592,675 B2 9/2009 Liaw
(Continued)

FOREIGN PATENT DOCUMENTS

JP 2008117838 A 5/2008
KR 100799101 B1 1/2008
KR 20090124624 A 12/2009

OTHER PUBLICATIONS

Wu, X., et al."Impacts of Nonrectangular Fin Cross Section on Electrical Characteristics of FinFET," IEEE Transactions on Electron Devices, vol. 52, No. 1, Jan. 2005, pp. 63-68.

*Primary Examiner* — Marc Armand
*Assistant Examiner* — Warren H Kilpatrick
(74) *Attorney, Agent, or Firm* — Slater Matsil, LLP

(57) ABSTRACT

A FinFET system comprises a first inverter comprising a first p-type pull-up transistor (PU) and a first n-type pull-down transistor (PD connected in series with the first PD, a second inverter cross-coupled to the first inverter comprising a second PU and a second PD connected in series with the second PD, a first pass-gate transistor, wherein the first pass-gate transistor is coupled between the first inverter and a first bit line, a second pass-gate transistor, wherein the second pass-gate transistor is coupled between the second inverter and a second bit line, a first dummy transistor coupled to a first common node of the first PU and the first PD and a second dummy transistor coupled to a second common node of the second PU and the second PD.

20 Claims, 23 Drawing Sheets

Related U.S. Application Data division of application No. 13/463,687, filed on May 3, 2012, now Pat. No. 9,041,115.

(51) Int. Cl.

| | | |
|---|---|---|
| *H01L 27/02* | (2006.01) | |
| *H01L 27/088* | (2006.01) | |
| *H01L 27/092* | (2006.01) | |
| *H01L 29/06* | (2006.01) | |
| *H01L 29/78* | (2006.01) | |
| *G11C 11/419* | (2006.01) | |
| *H01L 29/08* | (2006.01) | |
| *H01L 29/16* | (2006.01) | |
| *H01L 29/161* | (2006.01) | |
| *H01L 29/165* | (2006.01) | |

(52) U.S. Cl.
CPC ...... *H01L 27/0207* (2013.01); *H01L 27/0886* (2013.01); *H01L 27/0924* (2013.01); *H01L 27/1104* (2013.01); *H01L 29/0649* (2013.01); *H01L 29/0847* (2013.01); *H01L 29/161* (2013.01); *H01L 29/165* (2013.01); *H01L 29/1608* (2013.01); *H01L 29/7848* (2013.01); *H01L 29/7853* (2013.01); *H01L 29/7855* (2013.01)

(58) Field of Classification Search
USPC .......................................................... 257/369
See application file for complete search history.

(56) References Cited

U.S. PATENT DOCUMENTS

| | | |
|---|---|---|
| 2007/0048947 A1 | 3/2007 | Lee et al. |
| 2008/0099858 A1 | 5/2008 | Kawakita |
| 2008/0105932 A1* | 5/2008 | Liaw ..................... H01L 27/11 257/401 |
| 2008/0224178 A1 | 9/2008 | Pacha et al. |
| 2008/0296702 A1 | 12/2008 | Lee et al. |
| 2008/0308848 A1* | 12/2008 | Inaba ................... G11C 11/412 257/255 |
| 2009/0134472 A1 | 5/2009 | Inaba |
| 2009/0294874 A1 | 12/2009 | Lee |
| 2011/0068400 A1 | 3/2011 | Wang et al. |
| 2012/0001232 A1 | 1/2012 | Liaw |

* cited by examiner

FINFET MEMORY DEVICE

This application is a continuation of U.S. patent application Ser. No. 14/721,559, entitled "Structure for FinFETs" which was filed on May 26, 2015 and issued as U.S. Pat. No. 9,502,419 on Nov. 22, 2015, which is a divisional of U.S. patent application Ser. No. 13/463,687, entitled "Structure for FinFETs," which was filed on May 3, 2012 and issued as U.S. Pat. No. 9,041,115 on May 26, 2015, both of which are incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. However, the smaller feature size may lead to more leakage current. As the demand for even smaller electronic devices has grown recently, there has grown a need for reducing leakage current of semiconductor devices.

In a complementary metal oxide semiconductor (CMOS) field effect transistor (FET), active regions include a drain, a source, a channel region connected between the drain and the source, and a gate on top of the channel to control the on and off state of the channel region. When the gate voltage is more than a threshold voltage, a conductive channel is established between the drain and the source. As a result, electrons or holes are allowed to move between the drain and source. On the other hand, when the gate voltage is less than the threshold voltage, ideally, the channel is cut off and there are no electrons or holes flowing between the drain and the source. However, as semiconductor devices keep shrinking, due to the short channel leakage effect, the gate cannot fully control the channel region, especially the portion of the channel region which is far away from the gate. As a consequence, after semiconductor devices are scaled into deep sub-30 nanometer dimensions, the corresponding short gate length of conventional planar transistors may lead to the inability of the gate to substantially turn off the channel region.

As semiconductor technologies evolve, fin field effect transistors (FinFETs) have emerged as an effective alternative to further reduce leakage current in semiconductor devices. In a FinFET, an active region including the drain, the channel region and the source protrudes up from the surface of the semiconductor substrate upon which the FinFET is located. The active region of the FinFET, like a fin, is rectangular in shape from a cross section view. In addition, the gate structure of the FinFET wraps the active region around three sides like an upside-down U. As a result, the gate structure's control of the channel has become stronger. The short channel leakage effect of conventional planar transistors has been reduced. As such, when the FinFET is turned off, the gate structure can better control the channel so as to reduce leakage current.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments of the disclosure, and do not limit the scope of the disclosure.

The present disclosure will be described with respect to embodiments in a specific context, a fin field effect transistor (FinFET) having a tapered shape at its terminals. The embodiments of the disclosure may also be applied, however, to a variety of semiconductor devices. Hereinafter, various embodiments will be explained in detail with reference to the accompanying drawings.

Figure 1:
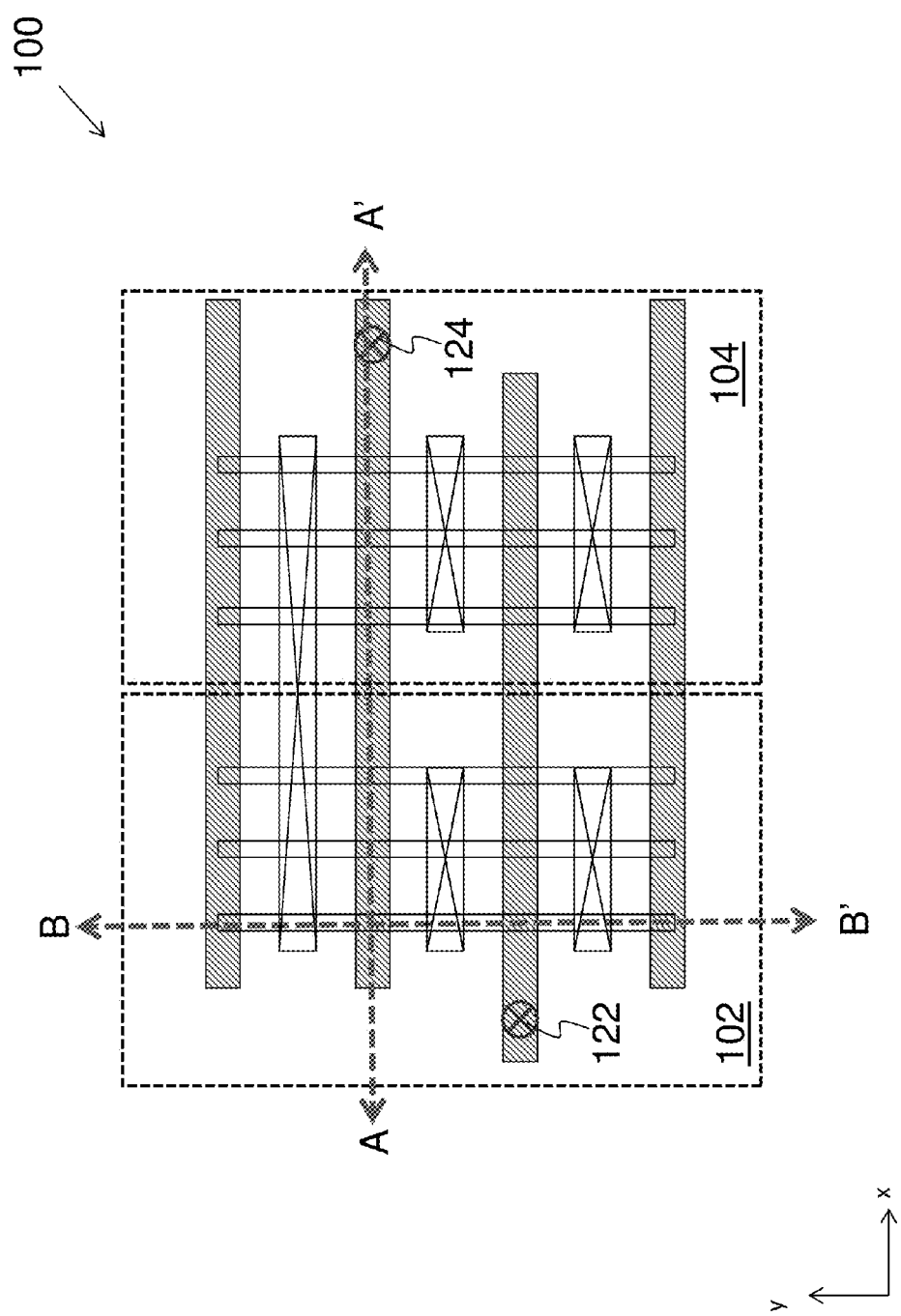
FIG. 1 illustrates a layout diagram of a semiconductor device having a plurality of FinFET transistors in accordance with an embodiment.

FIG. 1 illustrates a layout diagram of a semiconductor device having a plurality of FinFET transistors in accordance with an embodiment. The semiconductor device 100 includes two portions. The first portion 102 may be formed over an n-well. The second portion 104 is formed over a p-well. As person having ordinary skill in the art will readily understand that a drain/source region of a fin transistor is generally doped an opposite dopant type from the dopant type of the well in which the drain/source region is formed. For example, a drain/source region of a fin transistor is generally p-type doped when the well in which the active area is formed is an n-type well.

As shown in FIG. 1, the semiconductor device 100 may comprise four gate regions extending parallel from left to right across the first portion 102 and the second portion 104. The semiconductor device 100 may comprise six active regions. In particular, the first portion 102 comprises three active regions. In accordance with an embodiment, the active regions of the first portion 102 are a fin shaped structure (not shown but illustrated in FIG. 2) protruding over the surface of the semiconductor substrate. As shown in FIG. 1, the active regions are formed in parallel. Likewise, the second portion 104 comprises three active regions. In accordance with an embodiment, the active regions of the second portion 104 are a fin shaped structure protruding over the surface of the semiconductor substrate. As shown in FIG. 1, the gate regions and the active regions are orthogonal to each other. A transistor is formed at the cross point of a gate region and an active region.

The semiconductor device 100 may further comprise various contacts such as gate contact 122 and gate contact 124 formed over the gate regions. The contacts including gate contacts shown in FIG. 1 may be employed to couple different active regions of the semiconductor device 100. In accordance with an embodiment, the contacts can comprise any acceptable conductive material, such as a doped semiconductor or metal, such as copper, titanium, tungsten, aluminum, or the like.

Figure 2:
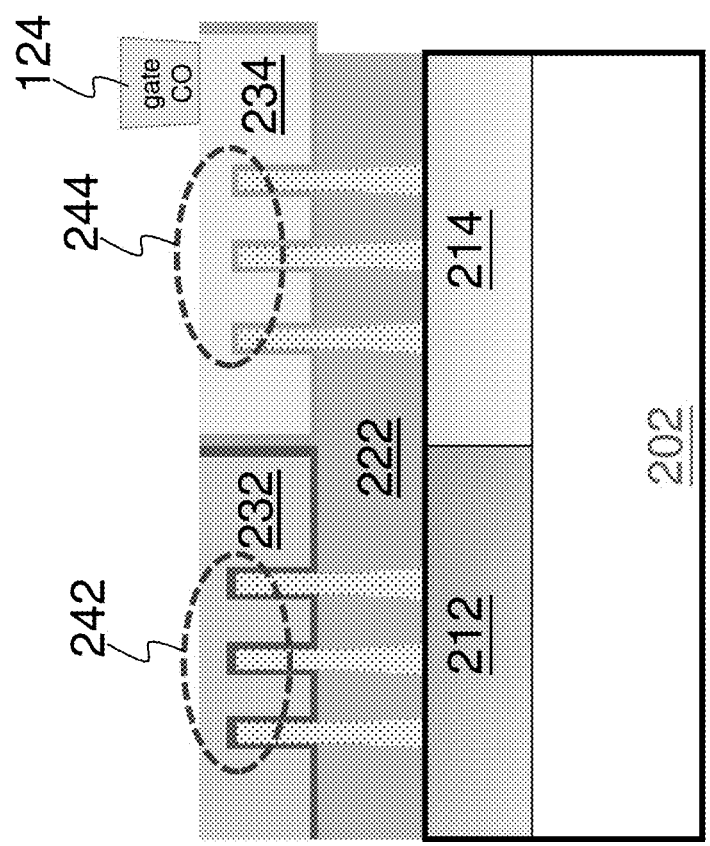
FIG. 2 illustrates a cross sectional view of the semiconductor device of FIG. 1 along the dashed line A-A' shown in FIG. 1.

FIG. 2 illustrates a cross sectional view of the semiconductor device of FIG. 1 along the dashed line A-A' shown in FIG. 1. As shown in FIG. 2, there may be six FinFETs formed over a substrate 202. The substrate 202 may be a silicon substrate. Alternatively, the substrate 202 may comprise other semiconductor materials such as germanium, compound semiconductor materials such as silicon carbide, gallium arsenide, indium arsenide, indium phosphide and the like. In accordance with an embodiment, the substrate 202 may be a crystalline structure. In accordance with another embodiment, the substrate 202 may be a silicon-on-insulator (SOI) substrate.

An n-well region 212 and a p-well region 214 are formed in the substrate 202. Referring back to FIG. 1, the first portion 102 of the semiconductor device 100 is formed over the n-well region 212. Likewise, the second portion 104 of the semiconductor device 100 is formed over the p-well region 214. Three fin structures 242 are formed over the n-well 212. As shown in FIG. 2, each fin structure protrudes up from the surface of the n-well 212. The fin structure is rectangular in shape from a cross section view. In addition, the gate electrode 232 wraps each fin structure around three sides like an upside-down U. It should be noted that there is a gate dielectric layer formed between the fin structure and the gate electrode. It should further be noted that while FIG. 2 shows the fin structure is rectangular in shape, the sidewall of the fin structure may not be a vertical line. The fin structure may be of a trapezoidal shape. In accordance with an embodiment, the bottom interior angle of the trapezoidal shape is greater than 86 degrees.

Likewise, three fin structures 244 are formed over the p-well 214. As shown in FIG. 2, each fin structure protrudes up from the surface of the p-well 214. The fin structure is rectangular in shape from a cross section view. In addition, the gate electrode 234 wraps each fin structure around three sides like an upside-down U. In addition, there may be a gate contact 124 formed over the gate electrode 234.

As shown in FIG. 2, the fin structures (e.g. fin structures 242 and 244) are partially enclosed by an isolation region 222. More particularly, the bottom portions of the fin structures (e.g., bottom portions of the fin structure 242) are embedded in the isolation region 222. In accordance with an embodiment, the isolation region 222 may be implemented by using a shallow trench isolation (STI) structure.

The STI structures (e.g., isolation region 222) may be fabricated by using suitable techniques including photolithography and etching processes. In particular, the photolithography and etching processes may comprise depositing a commonly used mask material such as photoresist over the substrate 202, exposing the mask material to a pattern, etching the substrate 202 in accordance with the pattern. In this manner, a plurality of openings may be formed as a result. The openings are then filled with dielectric materials to form the STI structures (e.g., isolation region 222). A chemical mechanical polishing (CMP) process is then performed to remove excess portions of the dielectric materials, and the remaining portions are the isolation region.

Figure 3:
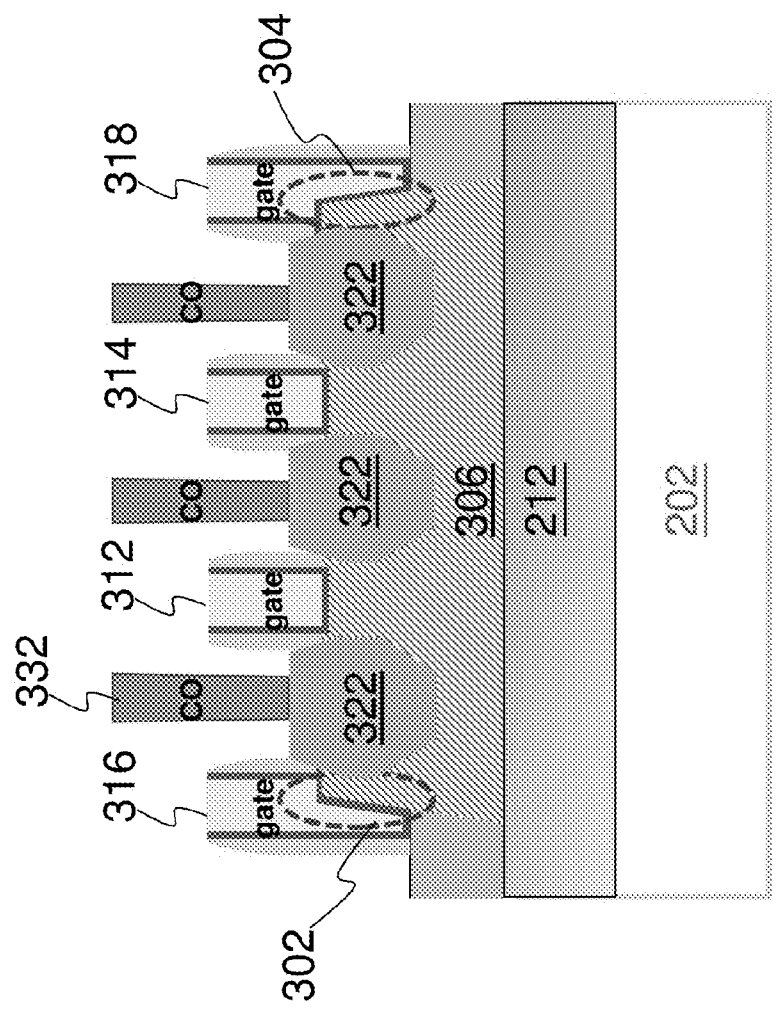
FIG. 3 illustrates a cross sectional view of the semiconductor device of FIG. 1 along the line B-B' in FIG. 1.

FIG. 3 illustrates a cross sectional view of the semiconductor device of FIG. 1 along the line B-B' in FIG. 1. In FIG. 3, gate structures 312 and 314 are formed over the fin line 306. The gate structures 312 and 314 may each include a gate dielectric, a gate electrode, and dielectric sidewall spacers. The gate dielectric and gate electrode can be formed by depositing a dielectric layer and an electrode layer sequentially on the substrate 202 and etching the layers into the patterned gate dielectric and gate electrode. A dielectric layer can then be conformally deposited and etched to form the dielectric sidewall spacers. A person having ordinary skill in the art will readily understand acceptable materials and processes for forming these components.

FIG. 3 further illustrates other two gate structures 316 and 318 partially formed over the fin line 306. In other words, the terminals of the fin line 306 are embedded in the gate structure 316 and 318 respectively. Referring back to FIG. 1, the end of the fin line is wrapped by the gate region from four sides. As shown in FIG. 1, the end of the fin line is embedded in the gate region. The cross section view shows the terminals of the embedded fin line has a tapered shape. More particularly, from the cross sectional view of FIG. 3, the bottom interior angle of the tapered shape is less than 83 degrees.

In FIG. 3, drain/source regions 322 are formed. The drain/source regions 322 can be formed by etching openings in the drain/source regions of the fin 306 and epitaxially growing the drain/source regions 322. The drain/source regions 322 can comprise, for example, silicon germanium (SiGe) for a p-type transistor or silicon carbon (SiC) for an n-type transistor, although other materials may be used.

In accordance with an embodiment, when the FinFET is a p-type transistor, an epitaxial growth material of the drain/source regions 322 is selected from a group consisting of SiGe, SiGeC, Ge, Si, III-V compound semiconductor materials and any combinations thereof. On the other hand, when the FinFET is an n-type transistor, an epitaxial growth material of the drain/source regions 322 is selected from a group consisting of SiP, SiC, SiPC, Si, III-V compound semiconductor materials and any combinations thereof.

The drain/source regions 322 can be appropriately doped after the epitaxial growth or can be in situ doped during the growth. After the drain/source regions 322 are formed, an additional sidewall spacer can be formed on the sidewalls of the gate structures (e.g., gate structure 312). The spacers can be formed by conformally depositing a dielectric layer over the substrate 202 and etching.

The semiconductor device may further comprise an interlayer dielectric layer (not shown) formed over the substrate 202 and fin 306. The interlayer dielectric layer is planarized to a top surface of the gate structures, such as by a chemical mechanical polish (CMP). Contact openings are etched, and a conductive material is deposited in the contact openings and over the interlayer dielectric layer.

The conductive material is planarized to a top surface of the interlayer dielectric layer, such as by a chemical mechanical polish (CMP), leaving conductive material in the contact openings to form contacts 332. The etching and deposition can be by any acceptable etching and deposition process, respectively.

The contacts 332 can comprise any acceptable conductive material, such as a doped semiconductor or metal, such as copper, titanium, tungsten, aluminum, or the like. Further, a barrier layer (not shown) may be formed between the conductive material and the interlayer dielectric layer, and an etch stop layer (not shown) may be formed over the substrate 202 under the interlayer dielectric layer. A person having ordinary skill in the art will readily understand appropriate processes and materials used for forming these components.

An advantageous feature of having a taper shaped fin terminal is that the taper shaped fin terminal helps to reduce the electrical field between the fin end and the dummy gate electrode (e.g., gate 316 and 318). As a result, the FinFET has uniform characteristics. Such uniform characteristics help to improve the speed and function of the FinFET.

Figure 4:
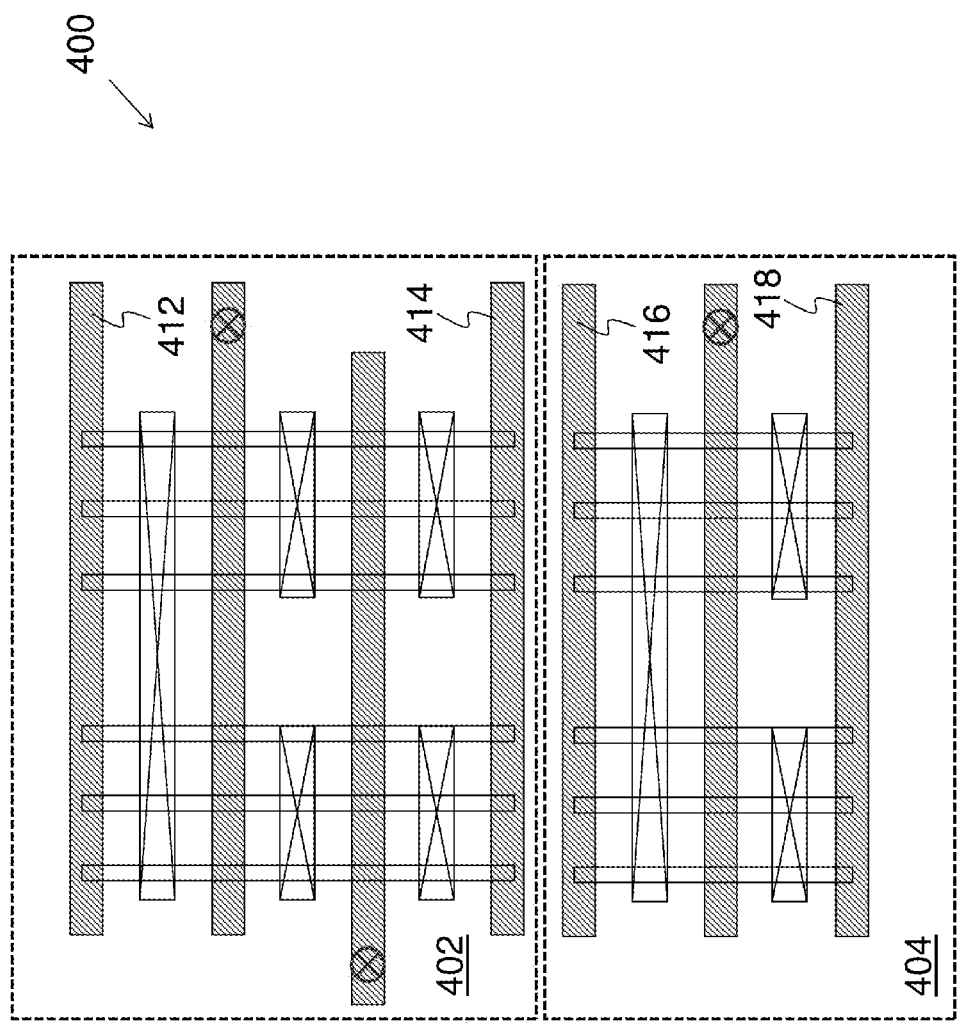
FIG. 4 illustrates a layout diagram of a FinFET transistor array in accordance with an embodiment.

FIG. 4 illustrates a layout diagram of a FinFET transistor array in accordance with an embodiment. The FinFET transistor array 400 includes two transistor cells, namely transistor cell 402 and transistor cell 404. Each transistor cell of FIG. 4 is similar to the semiconductor device 100 shown in FIG. 1, and hence is not discussed in further detail herein. It should be noted that the fin lines in FIG. 4 are not continuous between adjacent transistor cells. In order to further improve isolation between different FinFET transistors, the fin lines do not extend into the adjacent transistor cell. Instead, the fin line stops at the dummy gates (e.g., dummy gates 412, 414, 416 and 418).

It should further be noted that the dummy gates (e.g., dummy gates 412, 414, 416 and 418) may be coupled to ground when a fin line forms an n-type transistor on a p-well. On the other hand, the dummy gates may be coupled to a high voltage potential when a fin line forms a p-type transistor on an n-well.

Figure 5:
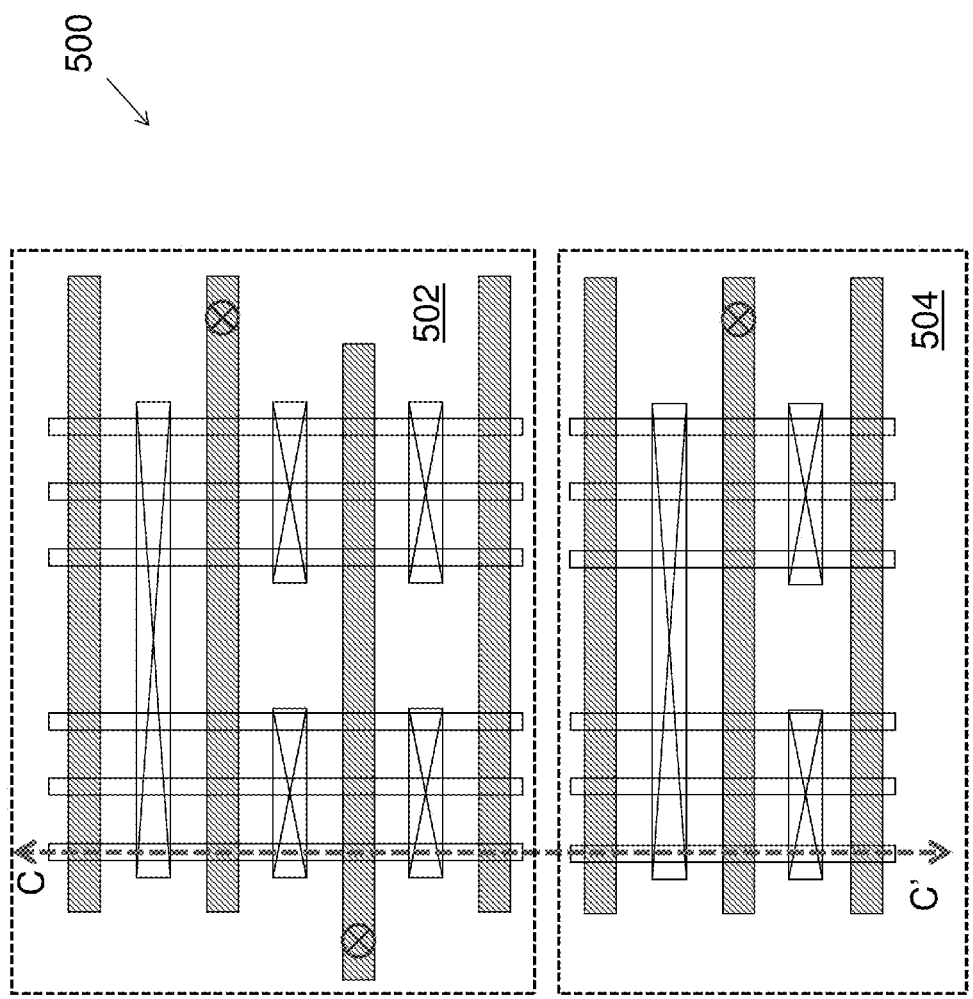
FIG. 5 illustrates a layout diagram of a FinFET transistor array in accordance with another embodiment.

FIG. 5 illustrates a layout diagram of a FinFET transistor array in accordance with another embodiment. The FinFET transistor array includes two transistor cells, namely transistor cell 502 and transistor cell 504. Each transistor cell of FIG. 5 is similar to the transistor cell shown in FIG. 4 except that the end of the fin line of each transistor cell is not embedded in the dummy gate. Instead, the fin line extends outside the gate region and forms a floating node. In comparison with the fin line shown in FIG. 1, the fin line structure shown in FIG. 5 helps to prevent the gate dielectric breakdown problem. As a result, the reliability of the FinFET is improved.

Figure 6:
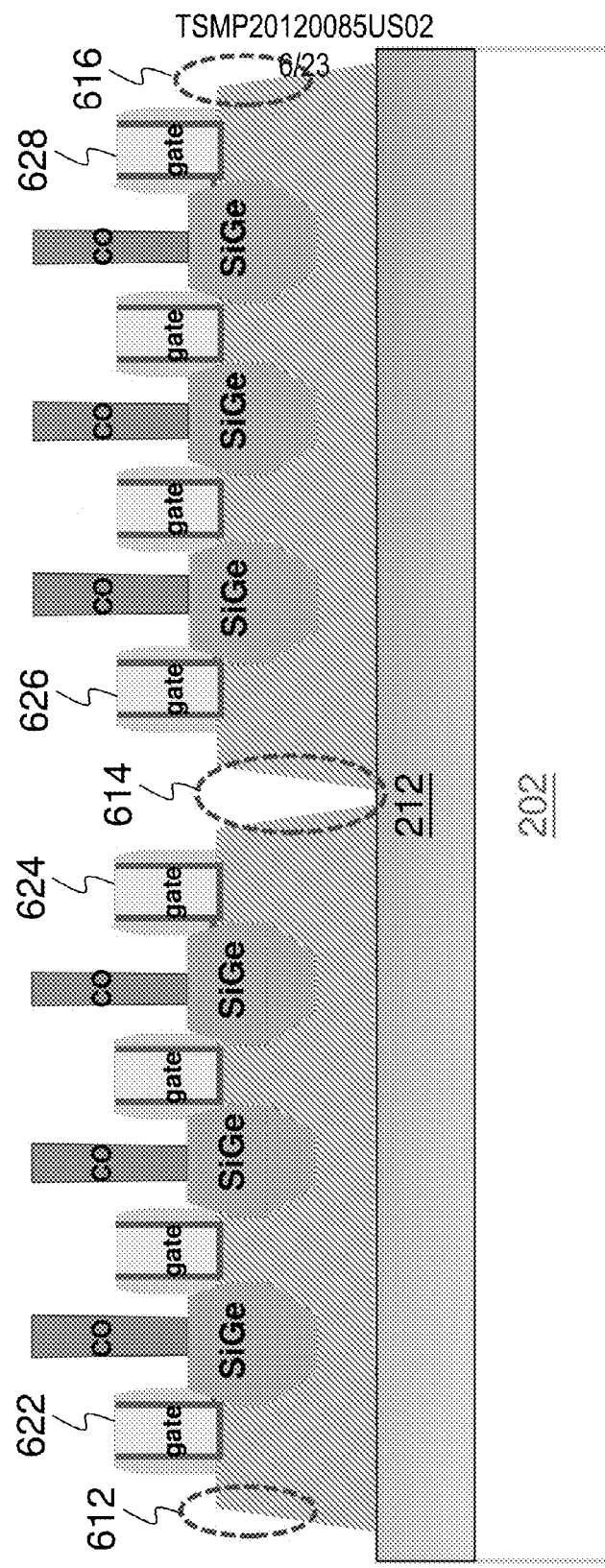
FIG. 6 illustrates a cross sectional view of the semiconductor device of FIG. 5 along the line C-C' in FIG. 5.

FIG. 6 illustrates a cross sectional view of the semiconductor device of FIG. 5 along the line C-C' in FIG. 5. The cross section view of FIG. 6 is similar to the cross sectional view shown in FIG. 3 except that the terminals of the fin line of each transistor cell is not embedded in the dummy gates. As shown in FIG. 6, the terminals of the fin lines (e.g., terminals 612, 614 and 616) are of a tapered shape. In addition, the gate structures (e.g., gate structures 622, 624, 626 and 628) are not formed on the sidewalls of the fin lines. Instead, the gate structures are formed over the top surface of the fin lines.

Figure 7:
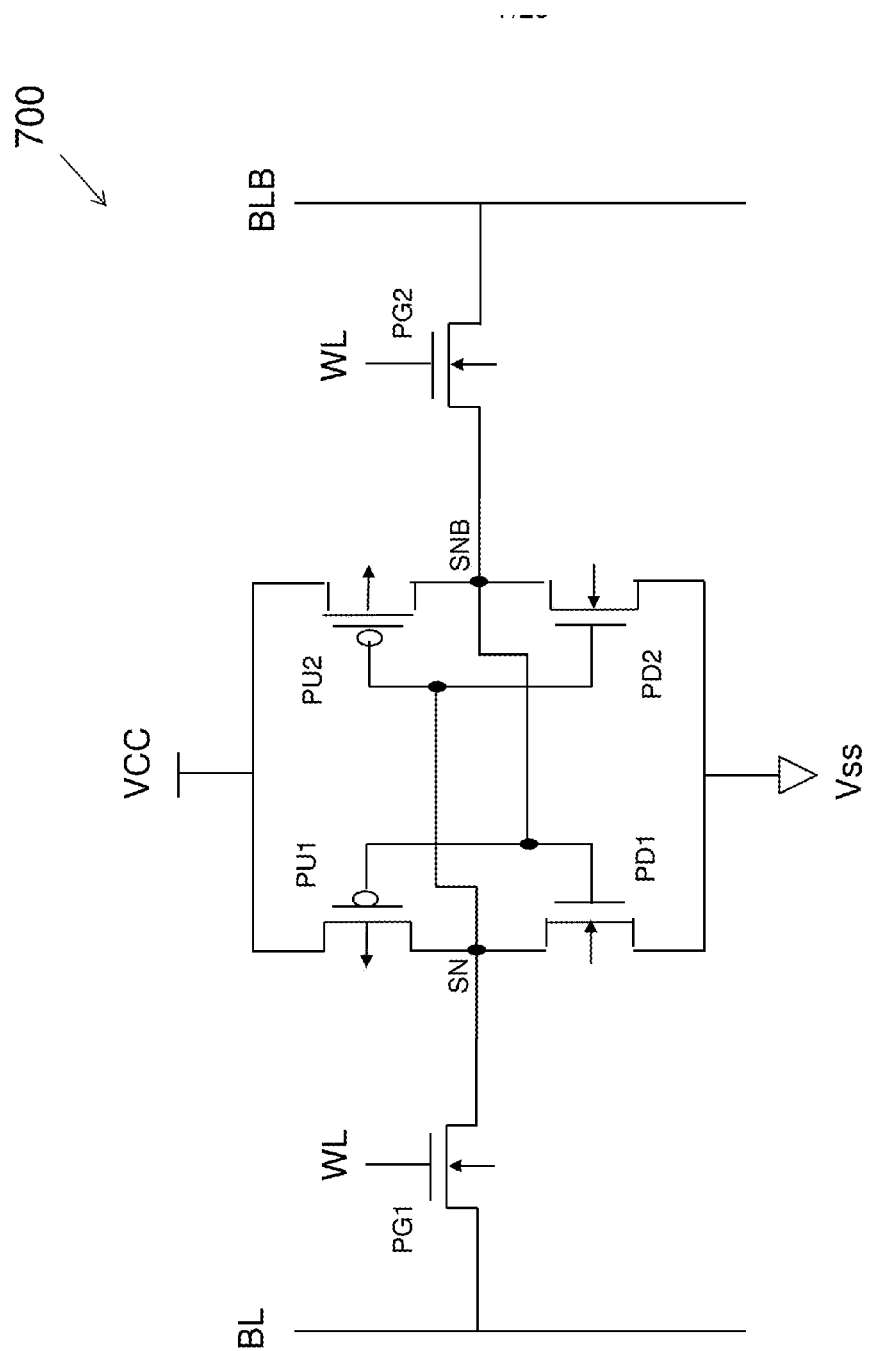
FIG. 7 illustrates a circuit diagram of a six transistor (6T) SRAM cell according to an embodiment.

FIG. 7 illustrates a circuit diagram of a six transistor (6T) SRAM cell according to an embodiment. The SRAM cell 700 comprises a first inverter formed by a pull-up p-type metal oxide semiconductor (PMOS) transistor PU1 and a pull-down n-type metal oxide semiconductor (NMOS) transistor PD1. The SRAM cell 700 further comprises a second inverter formed by a pull-up PMOS transistor PU2 and a pull-down NMOS transistor PD2. Furthermore, both the first inverter and second inverter are coupled between a voltage bus VCC and a ground potential VSS.

As shown in FIG. 7, the first inverter and the second inverter are cross-coupled. That is, the first inverter has an input connected to the output of the second inverter. Likewise, the second inverter has an input connected to the output of the first inverter. The output of the first inverter is referred to as a storage node SN. Likewise, the output of the second inverter is referred to as a storage node SNB. In a normal operating mode, the storage node SN is in the opposite logic state as the storage node SNB. By employing the two cross-coupled inverters, the SRAM cell 700 can hold the data using a latched structure so that the stored data will not be lost without applying a refresh cycle.

In an SRAM array (not shown) using the 6T SRAM cells, the cells are arranged in rows and columns. The columns of the SRAM array are formed by a bit line pairs, namely a first bit line BL and a second bit line BLB. In addition, the cells of the SRAM array are disposed between the respective bit line pairs. As shown in FIG. 7, the SRAM cell 700 is placed between the bit line BL and the bit line BLB.

As shown in FIG. 7, the SRAM cell 700 further comprises a first pass-gate transistor PG1 connected between the bit line BL and the output of the first inverter. The SRAM cell 700 further comprises a second pass-gate transistor PG2 connected between the bit line BLB and the output of the second inverter. The gates of the first pass-gate transistor PG1 and the second pass-gate transistor PG2 are connected to a word line (WL).

As shown in the circuit diagram of FIG. 7, transistors PU1, PU2 are p-type transistors. Transistors PU1 and PU2 can be implemented by a variety of p-type transistors such as planar p-type field effect transistors (PFETs), p-type fin field effect transistors (FinFETs) or the like. Transistors PD1, PD2, PG1, and PG2 are n-type transistors. Transistors PD1, PD2, PG1 and PG2 can be implemented by a variety of n-type transistors such as planar n-type field effect transistors (NFETs), n-type FinFETs or the like.

In operation, if the pass-gate transistors PG1 and PG2 are inactive, the SRAM cell 700 will maintain the complementary values at storage nodes SN and SNB indefinitely. This is so because each inverter of the pair of cross coupled inverters drives the input of the other, thereby maintaining the voltages at the storage nodes. This situation will remain stable until the power is removed from the SRAM, or, a write cycle is performed changing the stored data at the storage nodes.

During a WRITE operation, bit lines BL and BLB are set to opposite logic values according to the new data that will be written into the SRAM cell 700. For example, in an SRAM write operation, a logic state "1" stored in a data latch of the SRAM cell 700 can be reset by setting BL to "0" and BLB to "1". In response to a binary code from a row decoder (not shown), a word line coupled to the pass-gate transistors of the SRAM cell 700 is asserted so that the data latch is selected to proceed to a WRITE operation.

After the SRAM cell 700 is selected, both the first pass-gate transistor PG1 and the second pass-gate transistor PG2 are turned on. As a result, the storage nodes SN and SNB are connected to BL and BLB respectively. Furthermore, the storage node SN of the data latch is discharged by BL to "0" and the other storage node of the data latch is charged by BLB to "1". As a result, the new data logic "0" is latched into the SRAM cell 700.

In a READ operation, both BL and BLB of the SRAM cell 700 are pre-charged to a voltage approximately equal to the operating voltage of the memory bank in which the SRAM cell 700 is located. In response to a binary code from the row decoder, a word line coupled to the first pass-gate PG1 and the second pass-gate PG2 of the SRAM cell 700 is asserted so that the data latch is selected to proceed to a READ operation.

During a READ operation, through a turned on pass-gate transistors PG1 and PG2, one bit line coupled to the storage node storing a logic "0" is discharged to a lower voltage. Meanwhile, the other bit line remains the pre-charged voltage because there is no discharging path between the other bit line and the storage node storing a logic "1". The differential voltage between BL and BLB (approximately in a range from 50 to 100 mV) is detected by a sense amplifier (not shown). Furthermore, the sense amplifier amplifies the differential voltage and reports the logic state of the memory cell via a data buffer.

Figure 8:
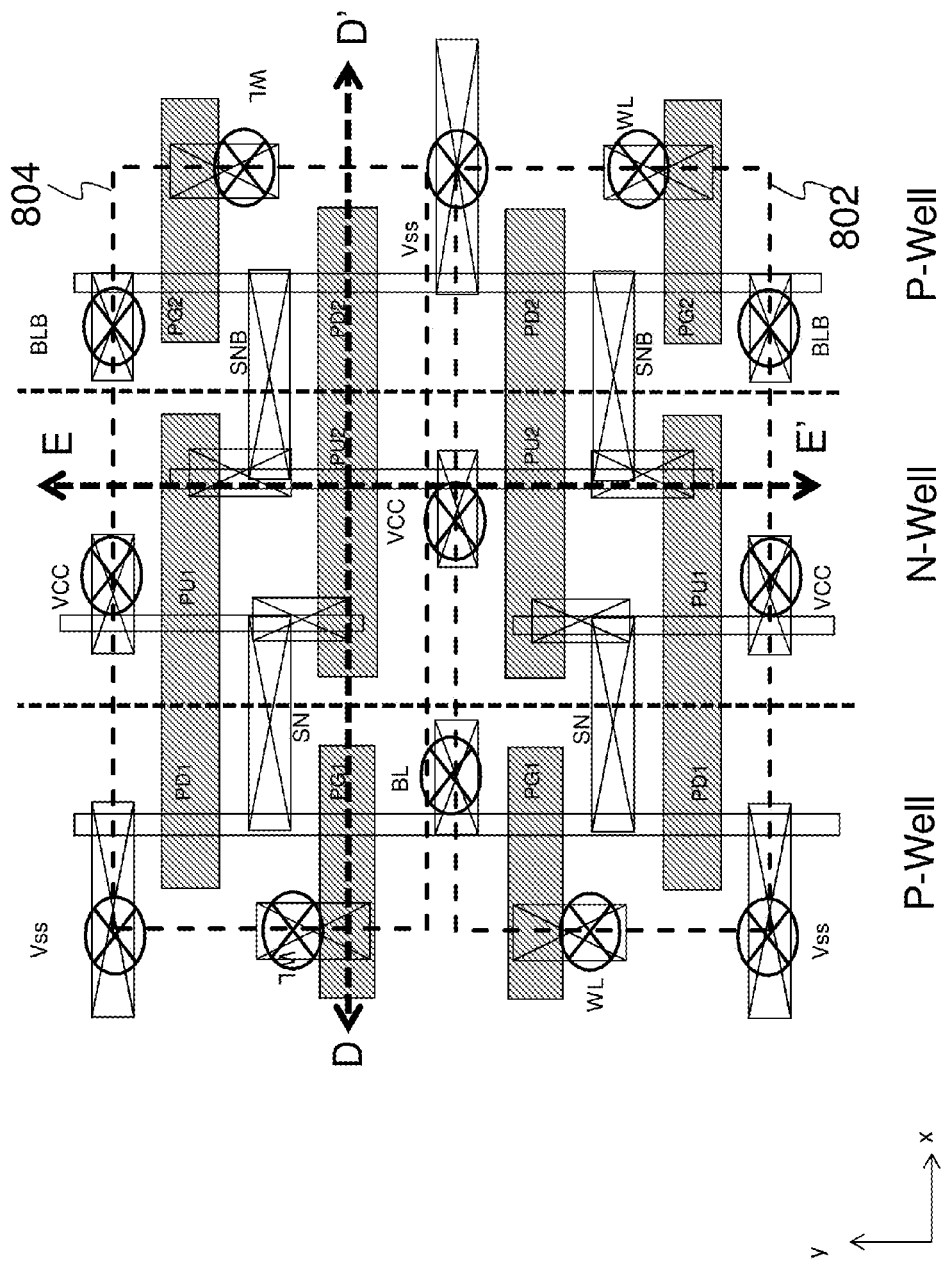
FIG. 8 illustrates a layout diagram of two adjacent SRAM cells in accordance with an embodiment.

FIG. 8 illustrates a layout diagram of two adjacent SRAM cells in accordance with an embodiment. As is known to those skilled in the art, when cells (e.g., SRAM cells 802 and 804) are arranged together to form an array, the cell layouts may be flipped or rotated to enable higher packing densities. Often by flipping the cell over a cell boundary or axis and placing the flipped cell adjacent the original cell, common nodes and connections can be combined to increase packing density.

The bottom portion of FIG. 8 illustrates a layout diagram of the SRAM cell shown in FIG. 7 in accordance with an embodiment. As shown in FIG. 8, there may be four active areas, each of which is formed by a fin line. The active regions extend parallel in a y-direction shown in FIG. 8 across the width of the SRAM cell 802. The bottom portion of FIG. 8 further illustrates four gate regions. The gate regions extend parallel in the x-direction shown in FIG. 8 along the length of the SRAM cell 802. In addition, the fin lines are orthogonal to the gate regions in the layout diagram. A transistor is formed at a cross point of a fin line and a gate region. As shown in FIG. 8, the six transistors of the SRAM cell are formed at different cross points. For example, the first pass-gate transistor PG1 is formed at the cross point of between the first fin line and the gate region labeled as PG1.

Two vertical dashed lines that intersect the SRAM cell 802 indicate boundaries between a p-type well in the substrate and an n-type well in the substrate in which respective fin transistors are formed. As person having ordinary skill in the art will readily understand that a drain/source region of a fin transistor is generally doped an opposite dopant type from the dopant type of the well in which the drain/source region is formed. For example, a source/drain region of a fin transistor is generally p-type doped when the well in which the active area is formed is an n-type well.

As shown in FIG. 8, the active areas of transistors PG1 and PD1 is formed in a p-type well. As a result, these transistors are n-type transistors. The active areas of transistors PU1 and PU2 are formed in an n-type well. As a result, these transistors are p-type transistors. The active areas of transistors PD2 and PG2 are formed in a p-type well. Similarly, these transistors are n-type transistors.

As shown in FIG. 8, a single gate region is used as the gates of transistors PD1 and PU1. Another single gate region is used as the gates of transistors PD2 and PU2. In this manner, each single gate region electrically couples the gates of the respective two transistors. In FIG. 8, a single gate region is dedicated to the pass-gate transistor PG1. Another single gate region is dedicated to the pass-gate transistor PG2. However, a person skilled in the art should recognize that the single gate region dedicated to the pass-gate transistor PG1 may extend beyond a cell boundary so that the gate region can be shared by an adjacent SRAM cell (not shown), as does the gate region for the pass-gate transistor PG2.

Various contacts and their corresponding interconnect vias may be employed to couple components in the SRAM cell 802. Through a via and a gate contact, a word line contact WL may be coupled to the gate of pass-gate transistor PG1, and another word line contact WL is coupled to the gate of pass-gate transistor PG2. Likewise, a bit line contact BL is coupled to the drain of pass-gate transistor PG1, and a complementary bit line contact BLB is coupled to the drain of pass-gate transistor PG2.

A power source contact VCC is coupled to the source of the pull-up transistor PU1, and another power source contact VCC is coupled to the source of the pull-up transistor PU2. A ground contact VSS is coupled to the source of the pull-down transistor PD1, and another ground contact VSS is coupled to the source of the pull-down transistor PD2. A storage node contact SN couples together the source of transistor PG1 and the drains of transistors PD1 and PU1. Another storage node contact SNB couples together the source of transistor PG2, and the drains of transistors PD2 and PU2.

The SRAM cell 804 is a duplicate cell but flipped over the X axis at the top of the SRAM cell 802. The common features BL, VCC, and VSS, are combined to save space. Thus the two cells pack into a space that is less than twice the cell boundary area. The N-wells are combined and extend in the Y direction, as do the P-wells.

FIG. 8 further illustrates in the p-well region, a continuous fin line is shared by two adjacent SRAM cells. In contrast, in the n-well region, a discontinuous fin line is employed to form transistors. For example, the PU1 of the SRAM cell 802 and the PU1 of the SRAM cell 804 are formed by two different fin lines. More particularly, in the SRAM cell 802, PU1 is formed at the cross point between a discontinuous fin line and its corresponding gate region. A first drain/source region of PU1 is coupled to VCC through a contact. A second drain/source region of PU1 is coupled to the storage node SN.

Figure 9:
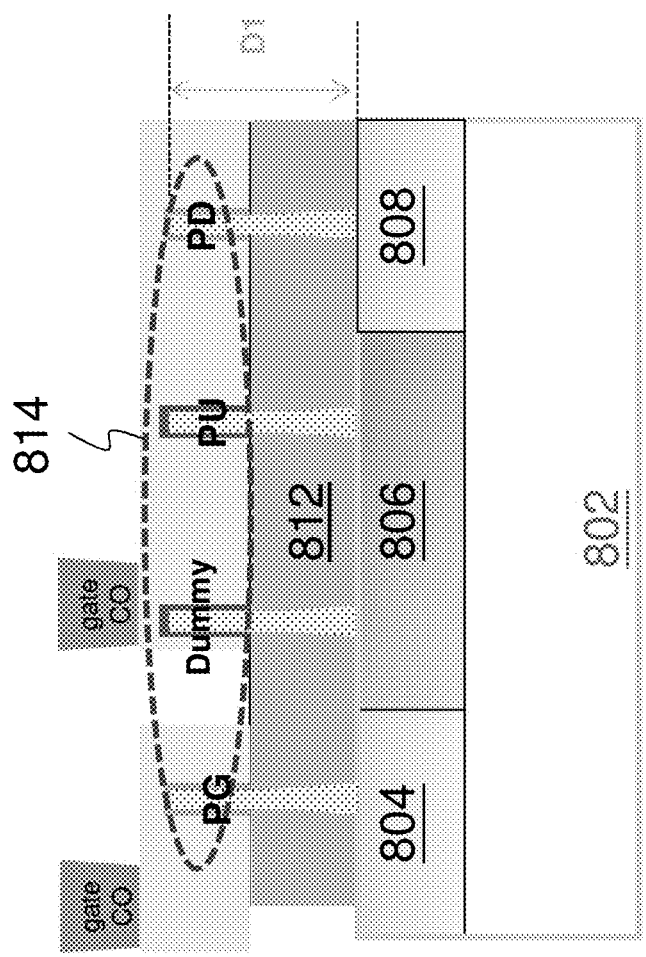
FIG. 9 further illustrates a cross sectional view of the SRAM cell along the dashed line D-D' shown in FIG. 8.

FIG. 9 further illustrates a cross sectional view of the SRAM cell along the dashed line D-D' shown in FIG. 8. As shown in FIG. 9, the cross sectional view of fin lines 814 shows that each fin line (e.g., fin lines PG, Dummy, PU and PD) is of a rectangular shape. The upper portion of the fin protrudes over the top surface of the isolation region 812. Moreover, the gate regions wrap the upper portions of the fin lines around three sides. As a result, the gate structure can better control the channel so as to reduce leakage current.

It should be noted while FIG. 9 shows that each fin line is of a rectangular shape from a cross sectional view, due to operational or processing variations, the fin line may be of a slightly different shape such as a trapezoidal shape. In accordance with an embodiment, if the fin line is of a trapezoidal shape, the bottom interior angle of the trapezoidal shape is greater than 86 degrees. It should further be noted that the height of the fin lines shown in FIG. 9 is defined as a first STI depth. The detailed definition of the first STI depth will be described below with respect to FIG. 10.

Figure 10:
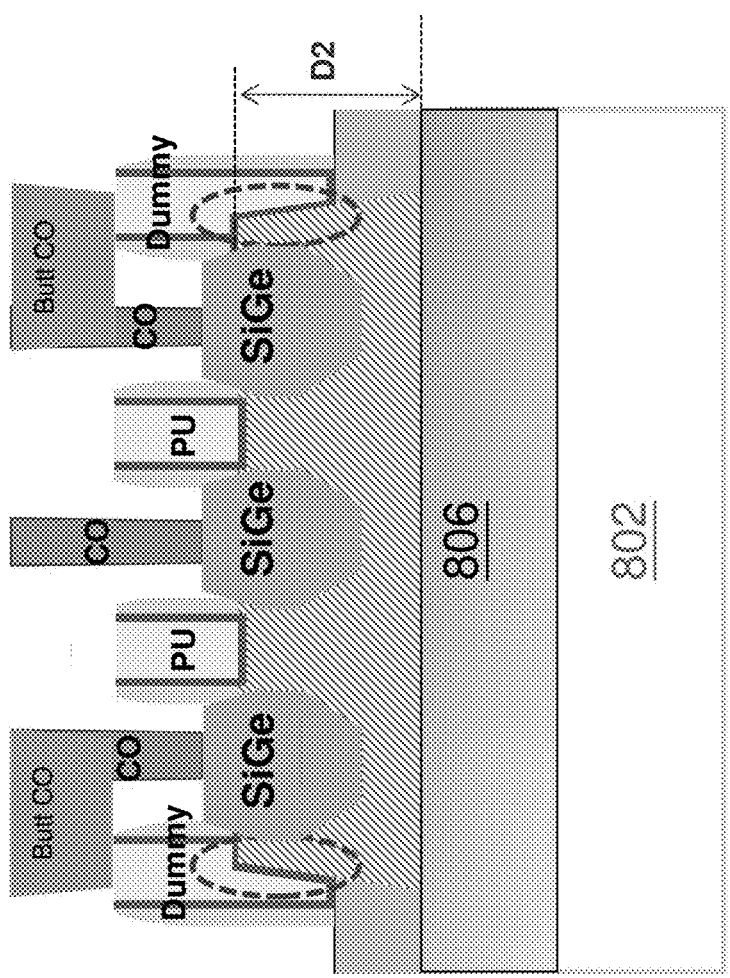
FIG. 10 illustrates a cross sectional view of the SRAM cell along the dashed line E-E' shown in FIG. 8.

FIG. 10 illustrates a cross sectional view of the SRAM cell along the dashed line E-E' shown in FIG. 8. The cross sectional view of FIG. 10 is similar to the cross sectional view shown in FIG. 3 except that a plurality of butt contacts are employed to couple the contacts of the drain/source regions and the dummy gate structures. In addition, the height of the fin line is defined as a second STI depth. In accordance with an embodiment, the ratio between the first STI depth shown in FIG. 9 and the second STI depth shown in FIG. 10 is approximately equal to 1.3.

Figure 11:
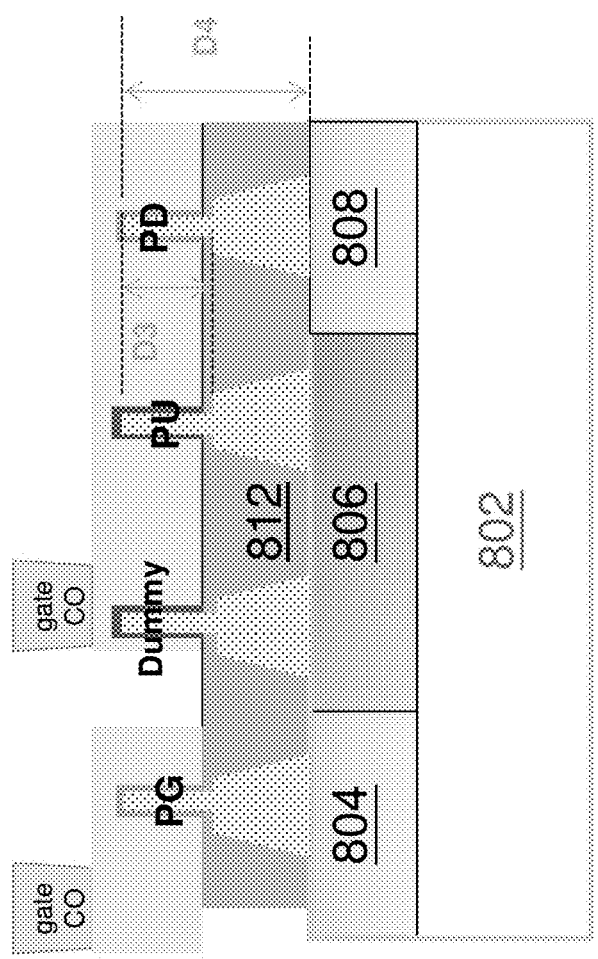
FIG. 11 illustrates a cross sectional view of the SRAM cell along the dashed line D-D' shown in FIG. 8 according to another embodiment.

FIG. 11 illustrates a cross sectional view of the SRAM cell along the dashed line D-D' shown in FIG. 8 according to another embodiment. The fin line is formed by two portions. Each fin comprises an upper rectangle stacked on top of a bottom trapezoid. In accordance with an embodiment, the bottom interior angle of the trapezoidal region is in a range from about 86 degrees to about 90 degrees.

It should be noted that the fin shape shown in FIG. 11 is merely an example, which should not unduly limit the scope of the claims. One of ordinary skill in the art would recognize many variations, alternatives, and modifications. For example, due to processing and operational variations, either the upper portion or the bottom portion may be of a shape similar to a trapezoid or a rectangle. A skilled person in the art will appreciate that a fin structure having a minor variation in shape is fully intended to be included within the scope of the present disclosure.

As shown in FIG. 11, the height of the upper portion of the fin line is defined as a third STI depth. Likewise, the height of the fin line is defined as a fourth STI depth. In accordance with an embodiment, the ratio between the fourth STI depth and the third STI depth is approximately equal to 2. One advantageous feature of having a wider bottom trapezoid is that the well resistance of the FinFET is improved because the wider width of the bottom rectangle helps to reduce the well resistance.

In accordance with an embodiment, in order to achieve better transistor threshold tuning, anti-punch through and well isolation, the upper portion of the upper rectangle and the upper portion of the bottom trapezoid may have different doping concentrations. For example, the upper portion of the rectangle may have a higher doping concentration than the upper portion of the rectangle.

Figure 12:
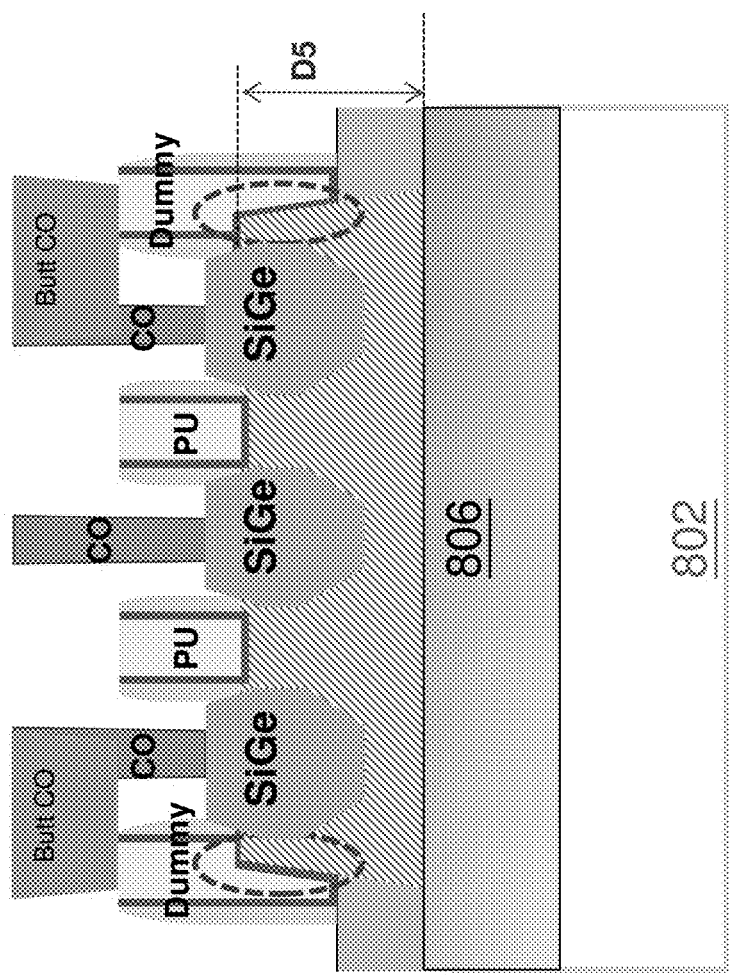
FIG. 12 illustrates a cross sectional view of the SRAM cell along the dashed line E-E' shown in FIG. 8.

FIG. 12 illustrates a cross sectional view of the SRAM cell along the dashed line E-E' shown in FIG. 8. The cross sectional view of FIG. 12 is similar to the cross sectional view shown in FIG. 10, and hence is not discussed in further detail herein. As shown in FIG. 12, the height of the fin line is defined as a fifth STI depth. In accordance with an embodiment, the ratio between the fourth STI depth shown in FIG. 11 and the fifth STI depth shown in FIG. 12 is approximately equal to 1.3.

Figure 13:
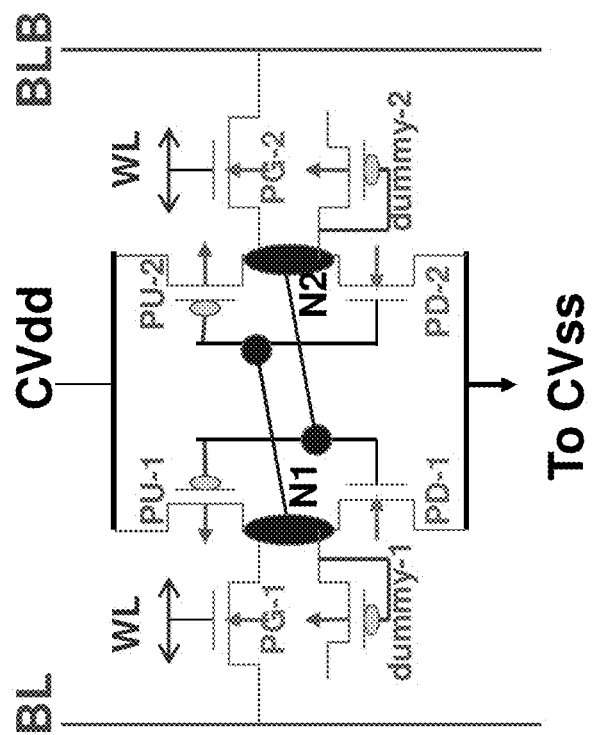
FIG. 13 illustrates a circuit diagram of a single port SRAM bit cell according to an embodiment.

FIG. 13 illustrates a circuit diagram of a single port SRAM bit cell according to an embodiment. The cell includes pull-up transistors PU1 and PU2, pull-down transistors PD1 and PD2, pass-gate transistors PG1 and PG2, and dummy transistors dummy-1 and dummy-2. As show in the circuit diagram, transistors PU1, PU2, IS1, and IS2 are p-type transistors, such as planar p-type field effect transistors (PFETs) or p-type fin field effect transistors (FinFETs), and transistors PD1, PD2, PG1, and PG2 are n-type transistors, such as planar n-type field effect transistors (NFETs) or n-type FinFETs.

The drains of pull-up transistors PU1 and pull-down transistor PD1 are coupled together, and the drains of pull-up transistor PU2 and pull-down transistor PD2 are coupled together. Transistors PU1 and PD1 are cross-coupled with transistors PU2 and PD2 to form a data latch. The gates of transistors PU1 and PD1 are coupled together and to the drains of transistors PU2 and PD2, and the gates of transistors PU2 and PD2 are coupled together and to the drains of transistors PU1 and PD1. Sources of the pull-up transistors PU1 and PU2 are coupled to power voltage Vdd, and the sources of the pull-down transistors PD1 and PD2 are coupled to a ground voltage Vss.

Storage node N1 of the data latch is coupled to bit line BL through pass-gate transistor PG1, and storage node N2 is coupled to complementary bit line BLB through pass-gate transistor PG2. Storage nodes N1 and N2 are complementary nodes that are often at opposite logic levels (logic high or logic low). Gates of pass-gate transistors PG1 and PG2 are coupled to a word line WL. The source and gate of the dummy transistor dummy-1 are coupled together and to the storage node N1, and the source and gate of the dummy transistor dummy-2 are coupled together and to the storage node N2. Drains of the dummy transistors dummy-1 and dummy-2 are depicted as floating, but may be coupled to respective dummy transistors in adjacent cells.

Figure 14:
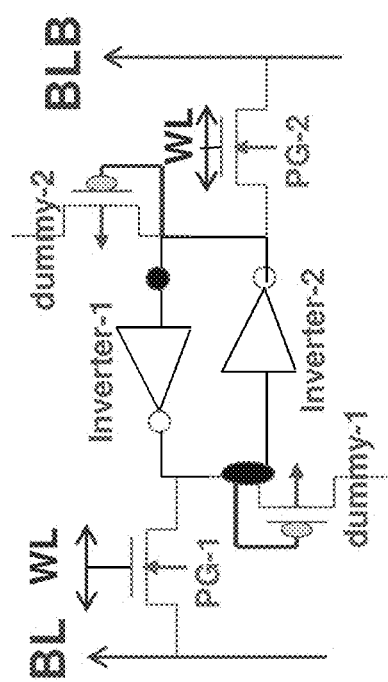
FIG. 14 illustrates an equivalent circuit of the SRAM cell shown in FIG. 13.

FIG. 14 illustrates an equivalent circuit of the SRAM cell shown in FIG. 13. The cross coupled inverters shown in FIG. 13 can be replaced by two inverters. As shown in FIG. 14, the first inverter's output is coupled to the second inverter's input. Likewise, the second inverter's output is coupled to the input of the first inverter. As such, the logic state of the SRAM cell can be reliably maintained.

Figure 15:
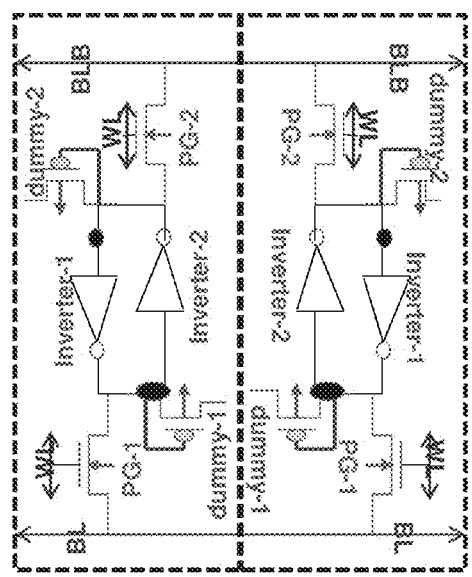
FIG. 15 illustrates a circuit diagram of an SRAM array having one column and two rows in accordance with an embodiment.

FIG. 15 illustrates a circuit diagram of an SRAM array having one column and two rows in accordance with an embodiment. The SRAM array 1500 includes two SRAM cells. Each SRAM cell has a structure similar to that shown in FIG. 14, and hence is not discussed in further detail to avoid unnecessary repetition.

Figure 16:
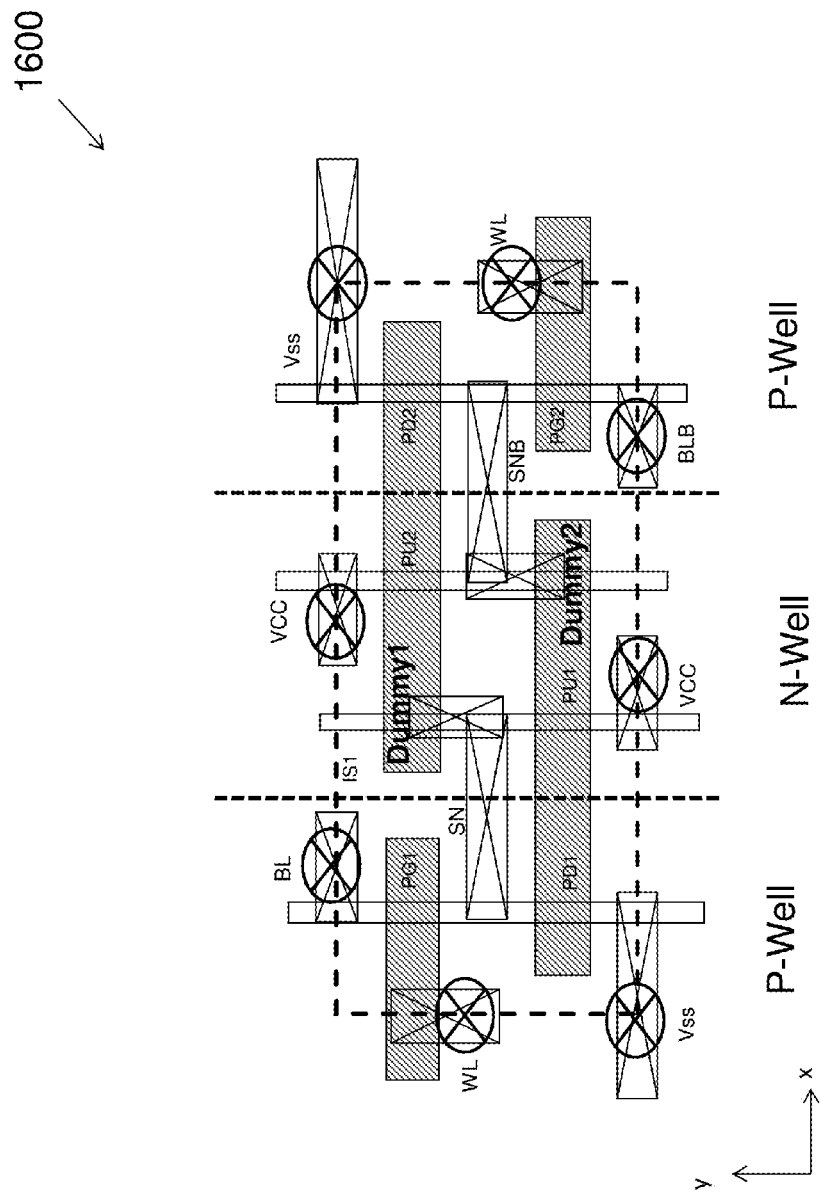
FIG. 16 illustrates a layout diagram of the SRAM cell shown in FIG. 13.

FIG. 16 illustrates a layout diagram of the SRAM cell shown in FIG. 13. In FIG. 16, an active area extends across the width of the cell in a p-type well to form components of transistors PG1 and PD1, and similarly, another active area extends across the width of the cell in a p-type well to form components of transistors PG2 and PD2. Likewise, in an n-type well, PU1 and Dummy1 are formed at the cross points between the first fin line and two gate regions respectively. The source and gate of Dummy1 are coupled together and to the storage node SN. The drain of Dummy1 is depicted as floating, but may be coupled to respective dummy transistors in adjacent cells. Similarly, PU2 and Dummy2 are formed at the cross points between the second fin line and two gate regions respectively. The source and gate of Dummy2 are coupled together and to the storage node SNB. The drain of Dummy2 is depicted as floating, but may be coupled to respective dummy transistors in adjacent cells.

Figure 17:
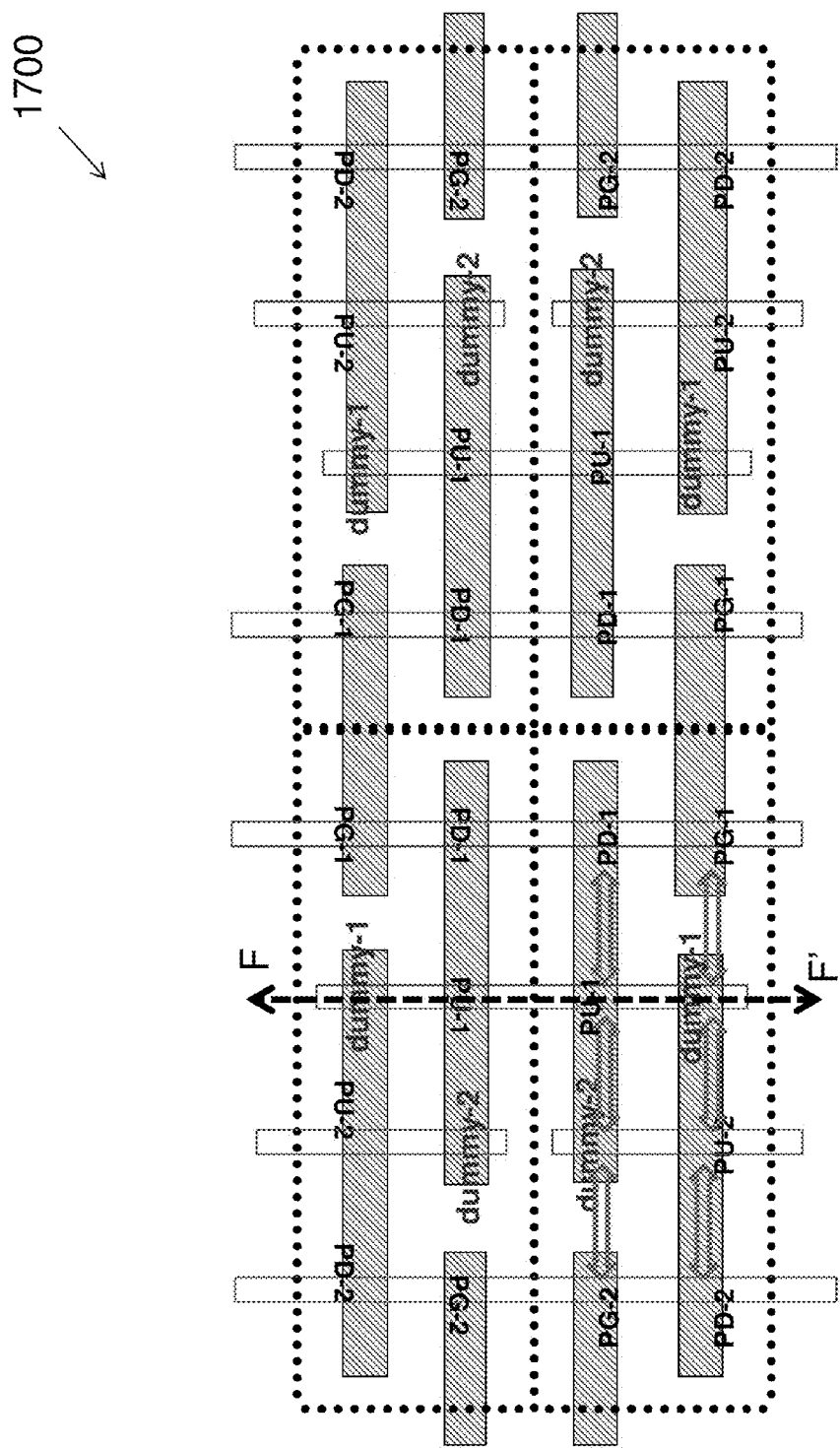
FIG. 17 illustrates a layout diagram of an SRAM array of two rows and two columns in accordance with an embodiment.

FIG. 17 illustrates a layout diagram of an SRAM array of two rows and two columns in accordance with an embodiment. Each SRAM cell of FIG. 17 is similar to the SRAM cell 1600 shown in FIG. 16, and hence is not discussed in further detail herein. The SRAM array 1700 has two columns and two rows of SRAM cells. As shown in FIG. 17, dummy transistors are formed in the SRAM array in an alternating manner. In particular, the dummy transistors in one SRAM cell are symmetrical to the dummy transistors in its adjacent SRAM cell. In other words, the dummy transistors in the SRAM array are mirror images along a border between the adjacent cells.

FIG. 17 further illustrates that pull down transistors and pass-gate transistors of the SRAM array are formed by continuous fin lines. In other words, the continuous fin lines extend throughout an array of SRAM cells. In contrast, the pull up transistors of the SRAM array are formed by discontinuous fin lines. In other words, the discontinuous fin lines cannot extend throughout the array of SRAM cells. One advantageous feature of having continuous fin lines is that the continuous fin lines can extend across multiple SRAM cells without being interrupted by an isolation area. This configuration can improve the uniformity of an array layout, and thereby, avoid lithography problems that may arise in forming the active areas, particularly fins for FinFET active areas and in small technology nodes.

FIG. 17 further illustrates dummy transistors formed in a symmetrical manner. One advantageous of having dummy transistor arranged in a symmetrical manner is that the coupling capacitance at bit lines of two adjacent SRAM cells is better balanced. Such balanced coupling capacitance helps to further improve the speed and function of an SRAM array. In addition, the dummy transistors arranged in a symmetrical manner shown in FIG. 17 help to improve other SRAM electrical characteristics such as operation speed, cell matching, minimum operational voltage and the like.

Figure 18:
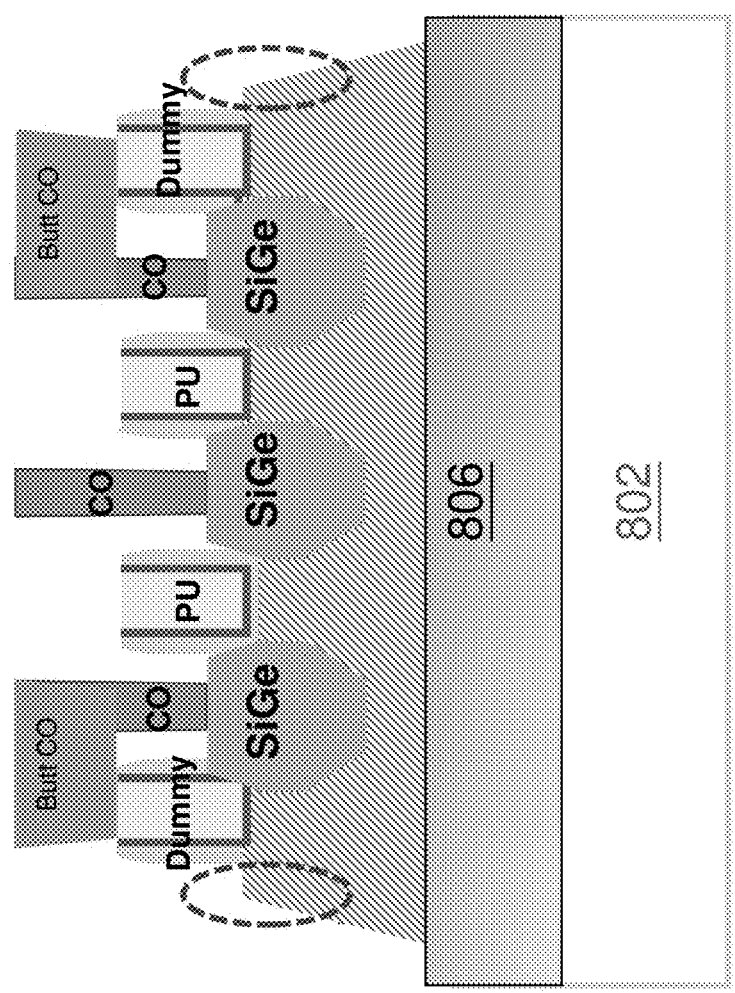
FIG. 18 illustrates a cross sectional view of the SRAM cell along the dashed line F-F' shown in FIG. 17.

FIG. 18 illustrates a cross sectional view of the SRAM cell along the dashed line F-F' shown in FIG. 17. The cross sectional view of FIG. 18 is similar to the cross sectional view shown in FIG. 6, and hence is not discussed in further detail herein.

Figure 19:
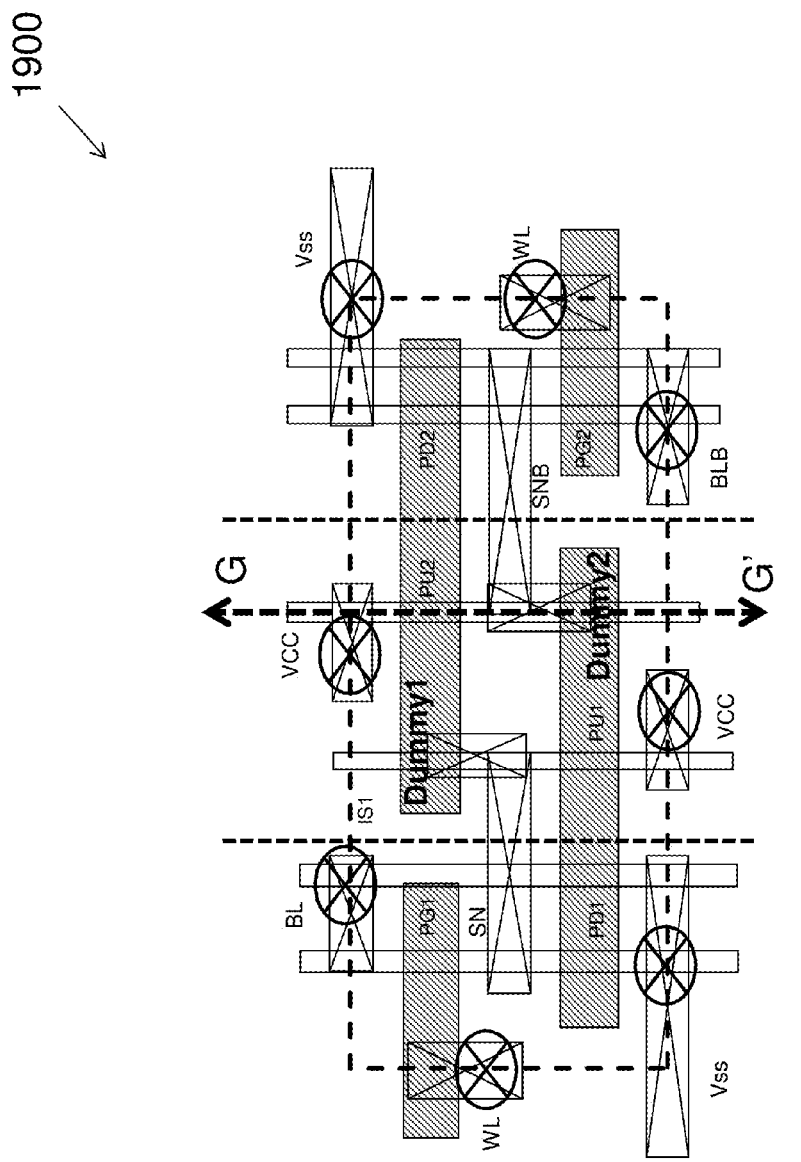
FIG. 19 illustrates a layout diagram of the SRAM cell shown in FIG. 13 in accordance with another embodiment.

FIG. 19 illustrates a layout diagram of the SRAM cell shown in FIG. 13 in accordance with another embodiment. The layout diagram of FIG. 19 is similar to that of FIG. 17 except that the transistors in the p-type wells are formed by two active areas. In FIG. 19, two active areas extend across the width of the cell in a p-type well to form components of transistors PG1 and PD1, and similarly, two active areas extend across the width of the cell in a p-type well to form components of transistors PG2 and PD2. Various modifications can be made to contacts and gates to extend to cover and/or contact appropriate components. One advantageous feature of having transistors PG1, PD1, PD2, and PG2 formed by two active regions is that the channel width of each transistor can be effectively doubled, thereby increasing the driving ability of each transistor.

Figure 20:
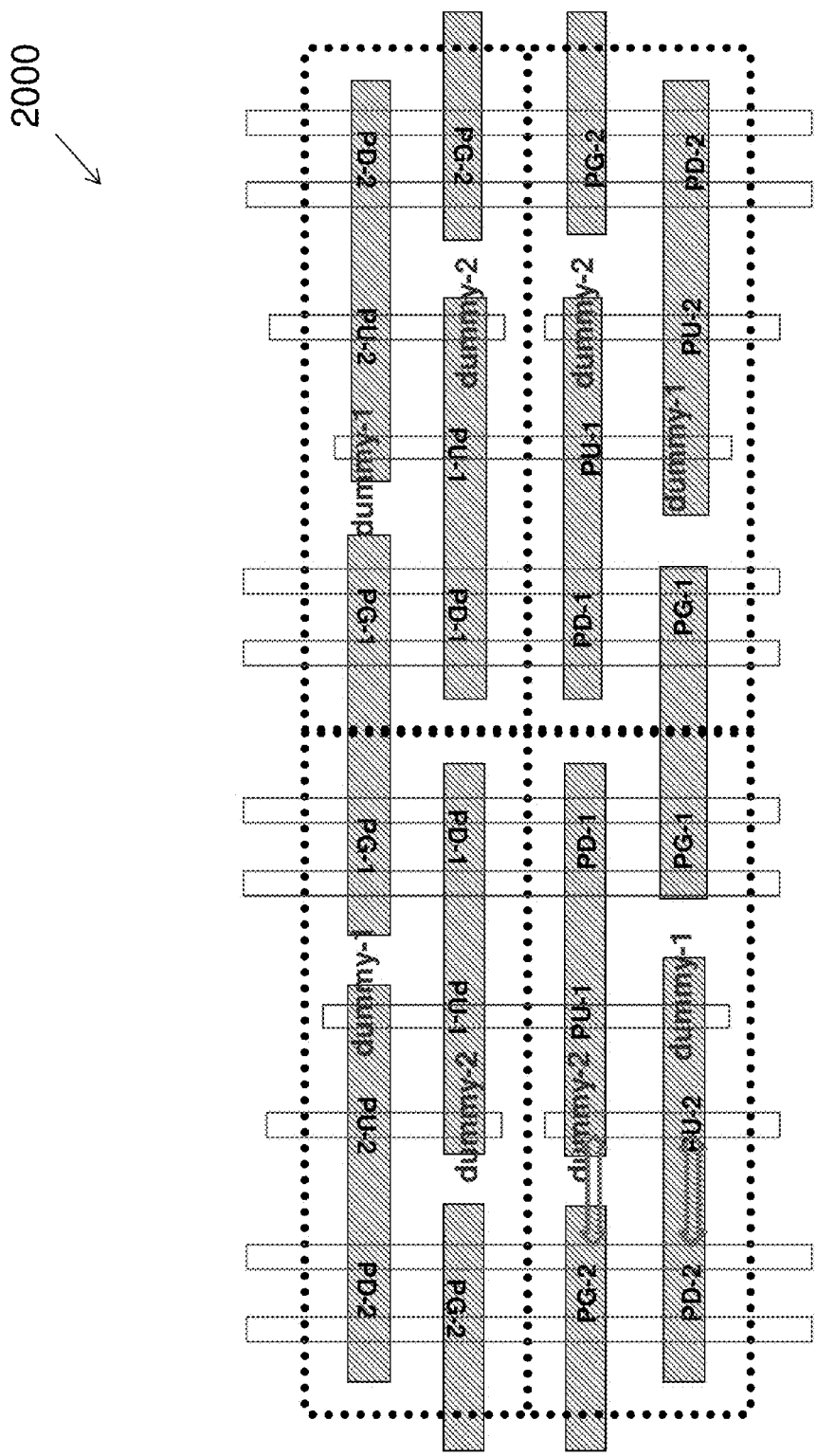
FIG. 20 illustrates a layout diagram of an SRAM array having two rows and two columns in accordance with another embodiment.

FIG. 20 illustrates a layout diagram of an SRAM array having two rows and two columns in accordance with another embodiment. The layout diagram of the SRAM array 2000 in FIG. 20 is similar to that of the SRAM array 1700 shown in FIG. 17 except that the transistors in the p-type wells are formed by two fin lines. An advantageous feature of having two fin lines is that the channel width of each transistor is increased so that the function and speed of the SRAM array may be improved as a result.

Figure 21:
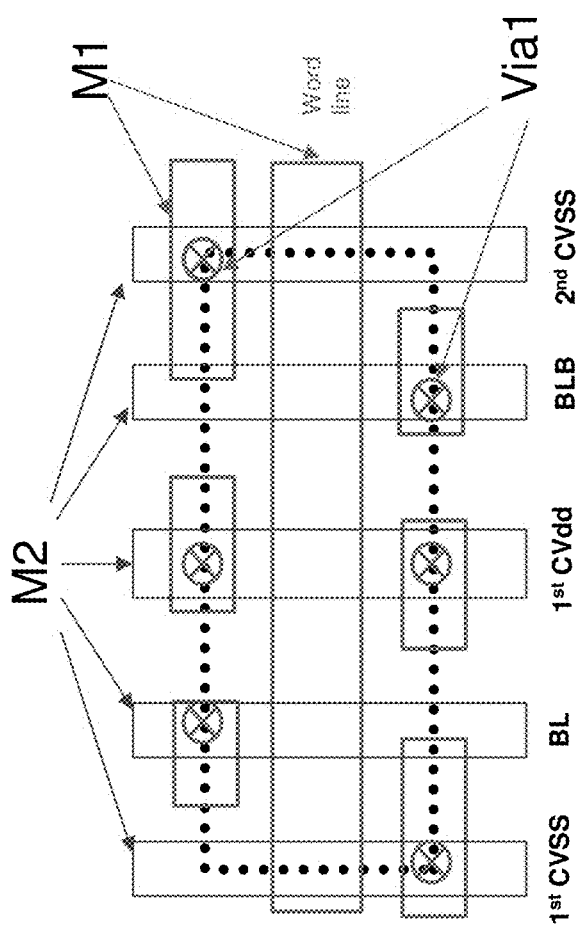
FIG. 21 illustrates a layout diagram of an SRAM cell in accordance with an embodiment.

FIG. 21 illustrates a layout diagram of an SRAM cell in accordance with an embodiment. Referring back to FIG. 7, the SRAM cell 700 may comprise a first VSS line, a second VSS line, a first bit line BL, a second bit line BLB and a power source line VCC. In FIG. 21, the five lines described above are formed in a second interconnect layer M2. More particularly, these five lines, namely VSS1, BL, VCC, BLB and VSS2, extend parallel in the y-axis shown in FIG. 21.

In FIG. 7, the SRAM cell 700 further comprises a first word line and its corresponding landing pads. As shown in FIG. 21, the first word line and landing pads are formed in the first interconnect layer M1. In addition, a plurality of vias Via1 are employed to couple the circuits of the first interconnect layer M1 and the circuits of the second interconnect layer M2.

Figure 22:
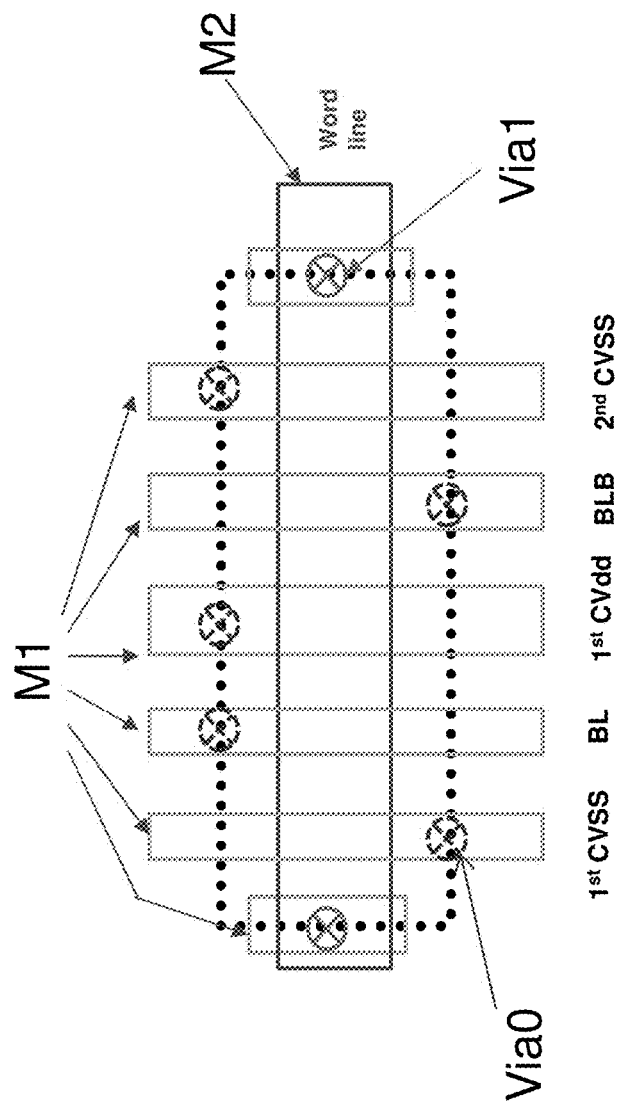
FIG. 22 illustrates a layout diagram of an SRAM cell in accordance with another embodiment.

FIG. 22 illustrates a layout diagram of an SRAM cell in accordance with another embodiment. The layout diagram of FIG. 22 is similar to that of FIG. 21 except that landing pads, VSS lines, Vdd lines, bit lines are formed in the first interconnect layer M1, and the word line is formed in the second interconnect layer M2. In addition, FIG. 22 shows there may be a plurality of vias Via0 formed between contacts and the first interconnect layer M1.

Figure 23:
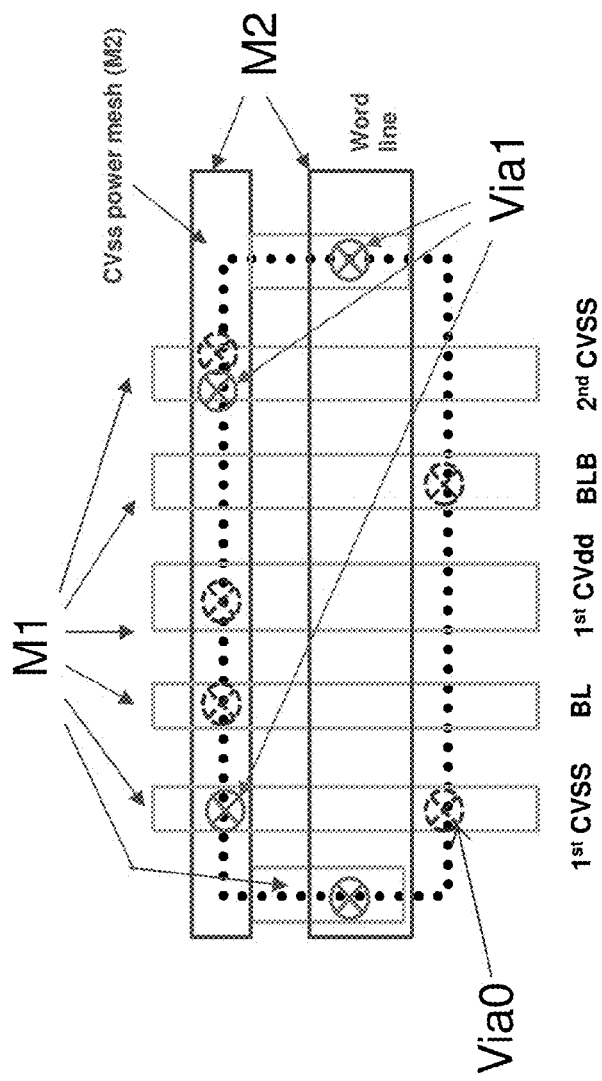
FIG. 23 illustrates a layout diagram of an SRAM cell in accordance with yet another embodiment.

FIG. 23 illustrates a layout diagram of an SRAM cell in accordance with yet another embodiment. The layout diagram of FIG. 23 is similar to that of FIG. 22 except that a VSS power mesh is employed to further improve the function and speed of the SRAM cell. As shown in FIG. 23, the VSS power mesh is formed in the second interconnect layer M2.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:
1. A system comprising:
   a first inverter comprising:
      a first p-type pull-up transistor (PU); and
      a first n-type pull-down transistor (PD), wherein the first PU is connected in series with the first PD;

a second inverter cross-coupled to the first inverter comprising:
  a second PU; and
  a second PD, wherein the second PU is connected in series with the second PD;
a first pass-gate transistor, wherein the first pass-gate transistor is coupled between the first inverter and a first bit line;
a second pass-gate transistor, wherein the second pass-gate transistor is coupled between the second inverter and a second bit line;
a first dummy transistor coupled to a first common node of the first PU and the first PD, wherein a source and a gate of the first dummy transistor is connected together and further connected to the first common node, and wherein the first dummy transistor is formed at a cross point between a fin line and a gate region, and the gate region wraps the fin line around three sides; and
a second dummy transistor coupled to a second common node of the second PU and the second PD, wherein a source and a gate of the second dummy transistor is connected together and further connected to the second common node.

2. The system of claim 1, wherein:
the first inverter, the second inverter, the first pass-gate transistor, the second pass-gate transistor, the first dummy transistor and the second dummy transistor are formed by a plurality of fin lines.

3. The system of claim 2, wherein:
the first pass-gate transistor and the first PD are formed by a first fin line;
the first dummy transistor and the first PU are formed by a second fin line;
the second dummy transistor and the second PU are formed by a third fin line; and
the second pass-gate transistor and the second PD are formed by a fourth fin line.

4. The system of claim 3, wherein:
the first fin line, the second fin line, the third fin line and the fourth fin line are in parallel.

5. The system of claim 3, wherein:
an end of the first fin line is of a tapered shape.

6. The system of claim 5, wherein:
the first fin line is of a trapezoidal shape from a cross section view along a longitudinal axis of the first fin line, and wherein the end of the first fin line is a leg of the trapezoidal shape.

7. The system of claim 6, wherein the first fin line comprises:
a channel connected between a first drain/source region and a second drain/source region of the first PD, and wherein the channel extends from first drain/source region to the second drain/source region in a first direction and the longitudinal axis of the first fin line is parallel with the first direction.

8. The system of claim 1, wherein:
a drain of the first dummy transistor is floating; and
a drain of the second dummy transistor is floating.

9. The system of claim 1, wherein:
a drain of the first dummy transistor and a drain of the second dummy transistor are connected to respective dummy transistors in an adjacent cell.

10. A system comprising:
a first memory cell comprising:
  a first inverter comprising:
    a first pull-up transistor (PU); and
    a first pull-down transistor (PD), wherein the first PU is connected in series with the first PD;
  a second inverter cross-coupled to the first inverter comprising:
    a second PU; and
    a second PD, wherein the second PU is connected in series with the second PD;
  a first dummy transistor connected to a first storage node of the first memory cell, wherein the first dummy transistor is formed at a cross point between a fin line and a gate region, and a top and two sidewalls of the fin line are covered by the gate region; and
  a second dummy transistor connected to a second storage node of the first memory cell; and
a second memory cell placed immediately adjacent to the first memory cell, wherein the second memory cell comprises a third dummy transistor and a fourth dummy transistor, and wherein the dummy transistors of the first memory cell and the dummy transistors of the second memory cell are formed in an alternating manner.

11. The system of claim 10, wherein:
the dummy transistors of the first memory cell and the dummy transistors of the second memory cell are placed in a symmetrical manner with respect to a border of the first memory cell and the second memory cell.

12. The system of claim 10, further comprising:
a first pass-gate transistor coupled between the first inverter and a first bit line; and
a second pass-gate transistor coupled between the second inverter and a second bit line.

13. The system of claim 12, wherein:
the first memory cell and the second memory cell are formed by a plurality of fin lines comprising:
  a first continuous fin line extending through the first memory cell and the second memory cell;
  a first discontinuous fin line within the first memory cell;
  a second discontinuous fin line within the second memory cell; and
  a second continuous fin line extending through the first memory cell and the second memory cell, wherein the first discontinuous fin line and the second discontinuous fin line are between the first continuous fin line and the second continuous fin line.

14. The system of claim 13, wherein:
the first discontinuous fin line is aligned with the second discontinuous fin line.

15. The system of claim 13, wherein:
pull-down transistors of the first memory cell and pass-gate transistors of the first memory cell are formed by the first continuous fin line and the second continuous fin line; and
pull-up transistors of the first memory cell and pull-up transistors of the second memory cell are formed by the first discontinuous fin line and the second discontinuous fin line.

16. The system of claim 13, wherein:
at least one dummy transistor of the first memory cell is formed by the first discontinuous fin line.

17. A system comprising:
a first memory cell comprising:
- a first inverter and a second inverter cross-coupled to the first inverter;
- a first dummy transistor connected to a first storage node of the first memory cell, wherein the first storage node is at an input of the first inverter, and wherein the first dummy transistor is formed at a cross point between a fin line and a gate region, and the gate region wraps the fin line around three sides; and
- a second dummy transistor connected to a second storage node of the first memory cell, wherein the second storage node is at an input of the second inverter; and a second memory cell placed immediately adjacent to the first memory cell, wherein the second memory cell comprises a third inverter, a fourth inverter cross-coupled to the third inverter, a third dummy transistor and a fourth dummy transistor, and wherein the dummy transistors of the first memory cell and the dummy transistors of the second memory cell are symmetrical with reference to a border between the first memory cell and the second memory cell.

18. The system of claim 17, wherein:
the first memory cell and the second memory cell are formed by a plurality of continuous fin lines and a plurality of discontinuous fin lines, and wherein:
each continuous fin line extends through the first memory cell and the second memory cell.

19. The system of claim 18, wherein:
at least one dummy transistor is formed by a discontinuous fin line.

20. The system of claim 19, wherein:
an end of the discontinuous fin line is of a tapered shape, and wherein:
the discontinuous fin line is of a trapezoidal shape from a cross section view along a longitudinal axis of the discontinuous fin line, and wherein the end of the discontinuous fin line is a leg of the trapezoidal shape.

* * * * *